United States Patent
Jang et al.

(10) Patent No.: US 7,349,519 B2
(45) Date of Patent: Mar. 25, 2008

(54) SHIFT REGISTER WITHOUT NOISE AND LIQUID CRYSTAL DISPLAY DEVICE HAVING THE SAME

(75) Inventors: Yong-Ho Jang, Gyeonggi-Do (KR); Binn Kim, Seoul (KR); Soo-Young Yoon, Gyeonggi-Do (KR)

(73) Assignee: LG. Philips LCD. Co., Ltd., Seoul (KR)

( * ) Notice: Subject to any disclaimer, the term of this patent is extended or adjusted under 35 U.S.C. 154(b) by 104 days.

(21) Appl. No.: 11/171,562

(22) Filed: Jun. 30, 2005

(65) Prior Publication Data

US 2006/0146979 A1    Jul. 6, 2006

(30) Foreign Application Priority Data

Dec. 31, 2004    (KR) .................. 10-2004-0118475

(51) Int. Cl.
*G11C 19/00*    (2006.01)
(52) U.S. Cl. .................. 377/64; 377/68; 377/79
(58) Field of Classification Search .............. None
See application file for complete search history.

(56) References Cited

U.S. PATENT DOCUMENTS

| | | | |
|---|---|---|---|
| 5,631,940 A * | 5/1997 | Fujikura ................. | 377/64 |
| 5,949,398 A * | 9/1999 | Kim ..................... | 345/100 |
| 6,295,046 B1 * | 9/2001 | Hebiguchi ............... | 345/100 |
| 6,556,646 B1 * | 4/2003 | Yeo et al. ............... | 377/54 |
| 6,876,353 B2 * | 4/2005 | Morosawa et al. ......... | 345/100 |
| 7,050,036 B2 * | 5/2006 | Kim et al. .............. | 345/100 |
| 2005/0220262 A1 * | 10/2005 | Moon ................... | 377/64 |

* cited by examiner

*Primary Examiner*—Tuan T Lam
(74) *Attorney, Agent, or Firm*—Brinks Hofer Gilson & Lione

(57) ABSTRACT

A shift register structure comprising a shift register for sequentially outputting voltages as a clock signal and a start voltage are inputted thereto, and a cleaner means connected to the shift register for removing noise within the start voltage. The cleaner means is a transistor for inputting a clock signal to a gate and for inputting a signal outputted from the shift register to a source.

22 Claims, 7 Drawing Sheets

SHIFT REGISTER WITHOUT NOISE AND LIQUID CRYSTAL DISPLAY DEVICE HAVING THE SAME

This application claims the benefit of Korean Patent Application No. 118475/2004, filed in Korea on Dec. 31, 2004, which is hereby incorporated by reference.

FIELD OF THE INVENTION

The present invention relates to a liquid crystal display (LCD) device, and more particularly, to a shift register of an LCD device capable of enhancing the stability of a circuit by removing noise from a signal.

DESCRIPTION OF THE RELATED ART

A liquid crystal display (LCD) device is a transparent flat panel display device, and is being widely applied to all kinds of electronic device such as a mobile phone, a PDA, a notebook computer, etc. Since an LCD device is light, thin and can provide high picture quality, it is becoming more widely used than other flat panel display devices. Moreover, because the demand for digital television (TV), better picture quality, and TVs that can be wall mounted is increasing, large LCD displays to be used for TVs are being sought after.

The LCD device is divided into multiple devices based on the method for driving liquid crystal molecules. Among the several devices, an active matrix thin film transistor (TFT) LCD device is primarily used due to its fast response time and minimal residual image.

FIG. 1 is a view showing a structure of a panel of the TFT LCD according to the related art. As shown, a plurality of gate lines 3 and data lines 5 arranged horizontally and vertically, respectively, for defining a plurality of pixels are formed on the liquid crystal panel 1. A thin film transistor, a switching device 7 is arranged in each pixel and is switched when a scan signal is inputted to the pixel through gate line 3 to apply an image signal inputted through data line 5 to a liquid crystal layer 9. The reference numeral 11 denotes a storage capacitor for sustaining an inputted data signal until the next scan signal is inputted to the pixel.

A scan signal is applied to the gate line 3 from a gate driving unit 20, and an image signal is applied to the data line 5 from a data driving unit 34. Generally, the gate driving unit 20 and the data driving unit 34 are formed as a driver integrated circuit (IC) and arranged outside the liquid crystal panel 1. However, an LCD device where the gate driving unit 20 is integrally formed at the liquid crystal panel is being actively researched. As the gate driving unit 20 is integrally formed at the liquid crystal panel 1, the LCD device has decreased size and volume and fabrication costs can be reduced.

The data driving unit 34 is mounted on a flexible circuit board 30 for connecting the liquid crystal panel 1 to a printed circuit board 36, and applies an image signal onto the liquid crystal layer 9 through the data line 5. On the printed circuit board 36, a timing controller and a line are formed.

FIG. 2 is a schematic view showing a structure of the gate driving unit 20 according to the related art. As shown, the gate driving unit 20 is provided with a plurality of shift registers 22. Signals are sequentially outputted from the shift registers 22 and applied to the gate lines G1~Gn. The shift registers 22 are connected to a clock generating unit 24, and thus a clock signal generated from the clock generating unit 24 is applied to the shift registers 22. A start voltage Vst1 is inputted to the shift registers 22, and an output signal of the previous shift register is inputted to the second shift register as a start voltage Vst2 after the first shift register.

FIG. 3 is a schematic diagram showing the structure of the shift registers 22 of FIG. 2 according to the related art. As shown, each of the shift registers 22 are provided with a plurality of transistors T1 to T8. A second transistor T2 is conducted by a high driving voltage Vdd and charges a second node ND2. A first transistor T1 is conducted by a start voltage Vst1, and discharges the second node ND2 and charges a first node ND1. A seventh transistor T7 is electrically connected to one side of the charged first node ND1 and is conducted by a high voltage charged to the first node ND1, thereby passing a clock signal C1 and applying an output signal Vout1 to the gate line G1. A fourth transistor T4 is conducted by an output of the next shift register, and discharges the first node ND1 and charges the second node ND2. An eighth transistor T8 is conducted by the charged second node ND2 and induces the clock signal C1 outputted through the seventh transistor T7 to fall into a low potential. A sixth transistor T6 is conducted as a start voltage is applied thereto, and discharges the second node ND2. And, a fifth transistor T5 is conducted by a high voltage charged to the first node ND1 and discharges the second node ND2.

The first node ND1 is a source electrode of the first transistor T1, and is a line for connecting a gate electrode of the seventh transistor T7 and a source electrode of the fourth transistor T4. The second node ND2 is a line for connecting a drain electrode of the second transistor T2, a gate electrode of the eight transistor T8, and a gate electrode of the third transistor T3. The first node ND1 and the second node ND2 determine an electric potential of the shift register. That is, when the first node ND1 is a high potential, the seventh transistor T7 is turned on thereby to output an output signal Vout1 of a high potential. On the contrary, when the second node ND2 is a high potential, the eight transistor T8 is turned on, thus an output terminal of the shift register has a low potential, and the output signal Vout1 of a high potential is transited into a low potential.

The operation of the shift register will be explained in more detail with reference to FIG. 4. First, when a start voltage (Vst1) of a high state, a first clock signal C1 of a low state, and a second clock signal C2 of a high state are inputted into the shift register at the first stage, the first transistor T1 and the sixth transistor T6 are turned on, so that the first node ND1 is charged by a high driving voltage Vdd and the second node ND2 is discharged. Accordingly, the seventh transistor T7 is turned on and the eighth transistor T8 is turned off, thereby outputting the first clock signal C1 of a low state through the seventh transistor T7. Accordingly, the output voltage Vout1 becomes a low state. The low output voltage Vout1 is inputted to the shift register of the next stage as a start voltage Vst2.

When the start voltage Vst1 becomes low and a first clock signal C1 of a high state and a second clock signal C2 of a low state are inputted to the shift register, the first transistor T1 is turned off and thus the first node ND1 becomes a floating state. Accordingly, the seventh transistor T7 maintains the ON state, and the fifth transistor T5 is turned off thereby discharging the second node ND2. Since the first clock signal C1 of a high state is outputted through the seventh transistor T7, the output voltage Vout1 becomes high.

While the start voltage Vst1 maintains the low state, the first node ND1 maintains the floating state and thereby the first clock signal C1 of the low state is outputted as the output voltage Vout1. Then, the fourth transistor T4 is turned on by a high output voltage from the shift register of the next stage and the floating state of the first node ND1 is removed. Accordingly, the seventh transistor T7 is turned off, so that the output voltage Vout1 of the low state becomes low and maintains the low state.

As the start voltage Vst1 is inputted to the shift register of a first stage, an output voltage Vout1 is outputted to an output terminal of the shift register of the first stage. The output voltage is applied to a first gate line of the LCD device. When the output voltage Vout1 is outputted from the shift register of the first stage, the shift register of the next stage is enabled to output an output voltage Vout2. The shift register of the second stage is enabled by the output voltage Vout1 of the previous stage. That is, a start voltage Vst2 of the second stage is the output voltage Vout1 of the previous stage.

As the start voltage Vst2 is inputted to the shift register of the second stage, an output voltage Vout2 is outputted as shown in FIG. 4. The output voltage Vout2 is inputted to the shift register of the next stage as a start voltage Vst3. By the above operation, signals of a waveform are sequentially inputted to the shift registers as shown in FIG. 4.

However, the shift register has the following problems. Generally, the shift register of the gate driving unit is integrally formed in a liquid crystal panel. Accordingly, a transistor formed at the shift register is a thin film transistor and is formed on a substrate. Since the transistor is formed on the substrate, a signal outputted through the seventh transistor T7 to be inputted to the shift register of the next stage generates noise by at least a capacitor. The noise delays the start voltage inputted to the shift register of the next stage or causes a deformation of the signal thereby causing improper operation of the circuit.

SUMMARY OF THE INVENTION

An object of the present invention is to provide a shift register structure capable of preventing a circuit from being improperly operated by providing a cleaner transistor that removes noise therein.

Another object of the present invention is to provide a liquid crystal display (LCD) device without the inadequacies of the related art LCD devices caused by currently known shift registers.

To achieve these and other advantages and in accordance with the purpose of the present invention, as embodied and broadly described herein, there is provided a shift register structure comprising: a shift register for sequentially outputting voltages as a clock signal and a start voltage are inputted thereto; and a cleaner means connected to the shift register for removing noise included in the start voltage.

The cleaner means is a cleaner transistor for inputting a clock signal to a gate and inputting a signal outputted from the shift register to a source. The shift register structure further comprises a first transistor for outputting an output signal of the shift register as a start voltage of a next stage by being synchronized with the output signal of the shift register.

The shift register comprises a second transistor including a gate to which a start voltage is applied, a source to which a driving voltage is applied, and a drain connected to a first node; a third transistor including a gate and a source to which a driving voltage is applied, and a drain connected to a second node; a fourth transistor including a gate connected to an output terminal of a shift register of a next stage and a source connected to the first node, for discharging the first node and charging the second node; a fifth transistor including a gate connected to the first node and a source connected to the second node, for discharging the second node; a sixth transistor including a gate connected to the first node, a source to which a clock signal is inputted, and a drain connected to an output terminal, for outputting a clock signal as an output voltage; and a seventh transistor including a gate connected to the second node and a source connected to an output terminal, for lowering the clock signal outputted through the sixth transistor into a low potential.

The LCD device comprises a liquid crystal panel having pixels defined by gate lines and data lines and thin film transistors formed in each pixel, for displaying an image; and a shift register having a cleaner means for sequentially applying signals to the gate lines and removing noise of the inputted signals.

The LCD device further comprises a clock generating unit for applying a clock signal to the shift register; and a data driving unit for applying image information to the liquid crystal panel. The shift register is integrally formed at the liquid crystal panel with the thin film transistor.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, a shift register of a liquid crystal display (LCD) device according to the present invention will be explained with reference to the attached drawings.

Figure 5:
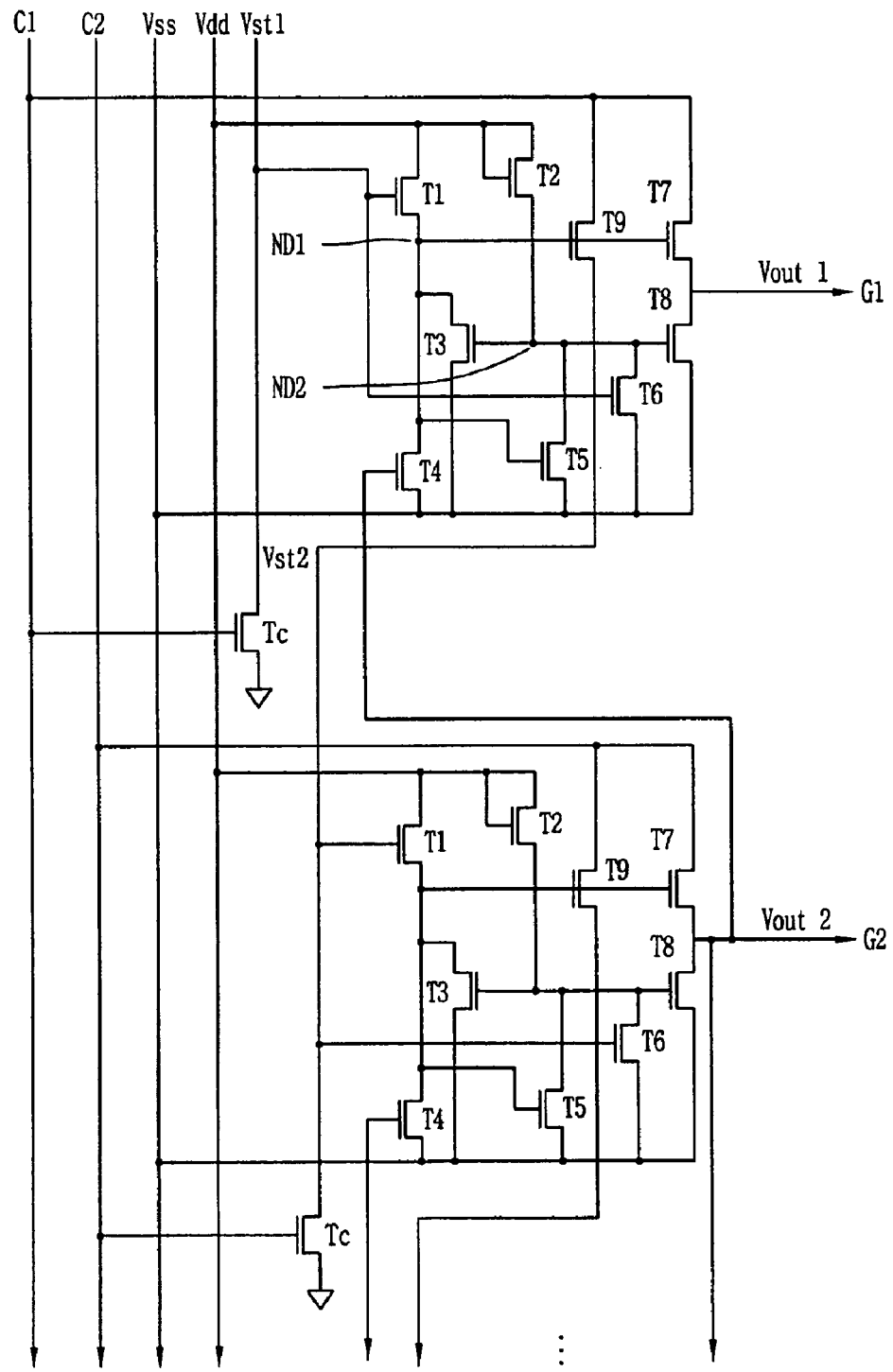
FIG. 5 is a circuit diagram showing a shift register according to a first embodiment of the present invention.
Figure 6:
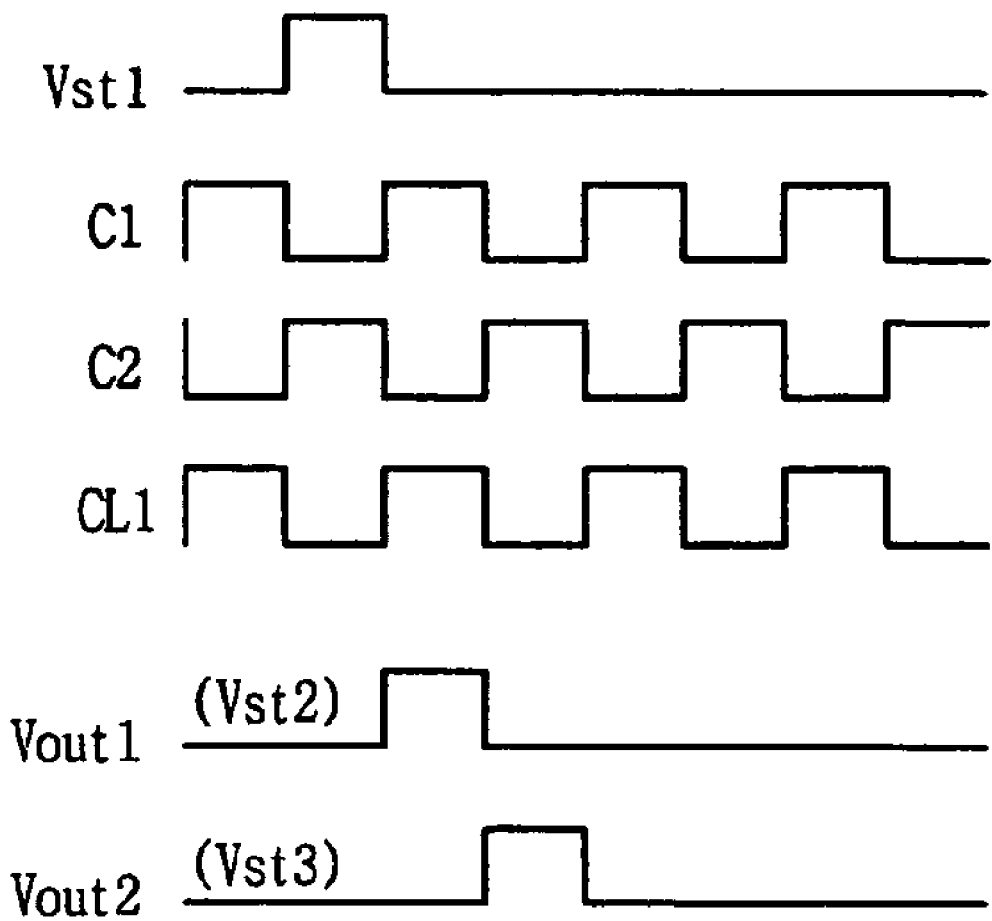
FIG. 6 is a view showing a waveform of the shift register of FIG. 5.

FIG. 5 is a circuit diagram showing a shift register according to a first embodiment of the present invention, and FIG. 6 is a view showing a waveform of the shift register of FIG. 5.

Figure 1:
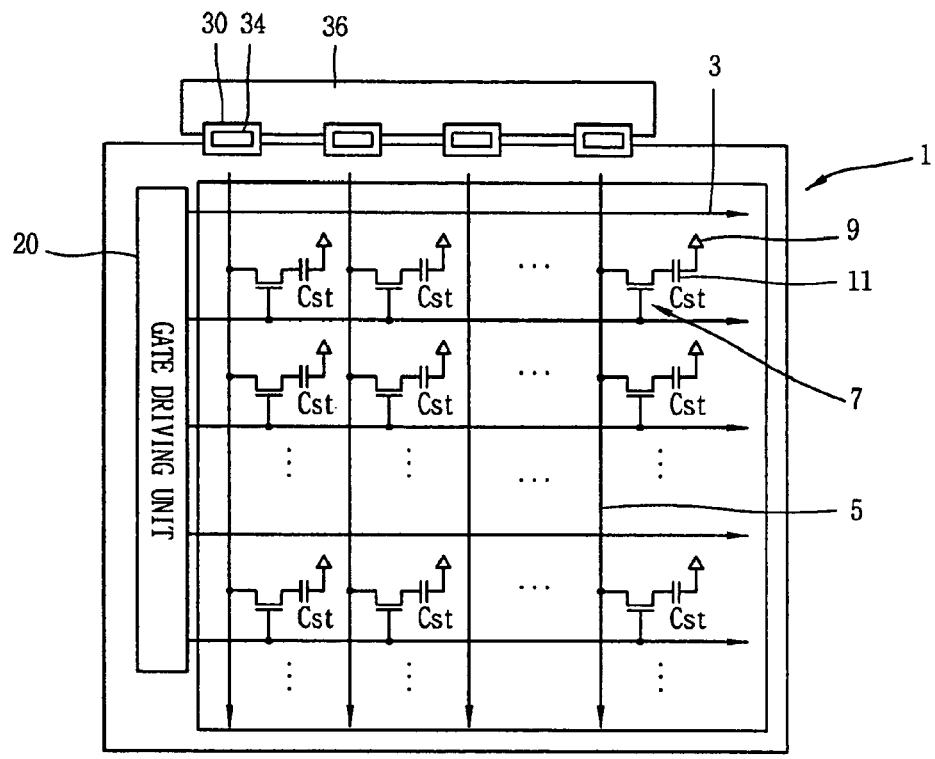
FIG. 1 is a plane view showing a structure of a general liquid crystal display (LCD) device according to the related art.
Figure 2:
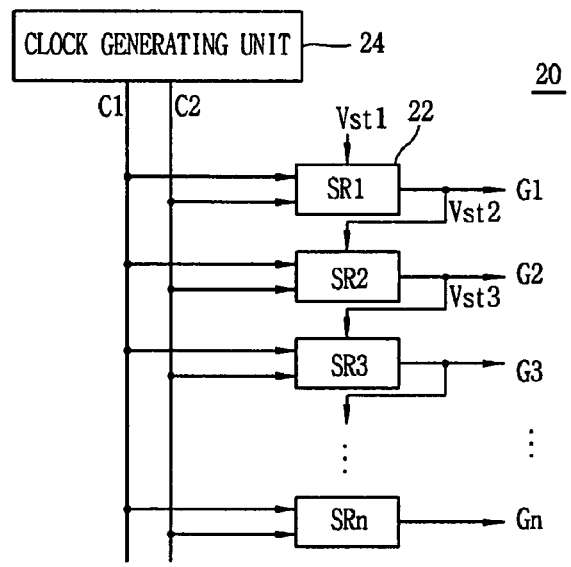
FIG. 2 is a view schematically showing a structure of a shift register of the LCD device according to the related art.
Figure 3:
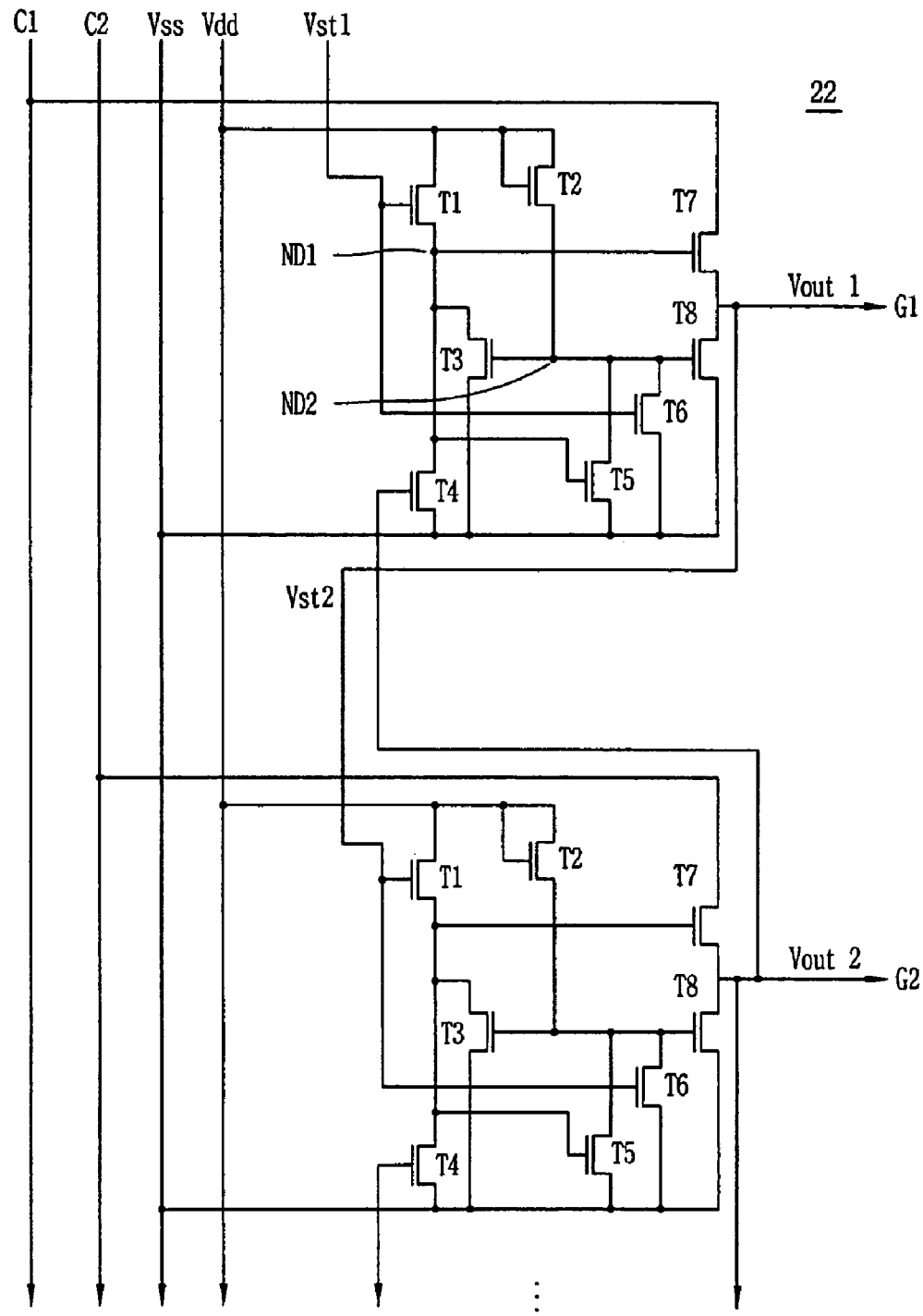
FIG. 3 is a circuit diagram showing of the shift register according to the related art.
Figure 4:
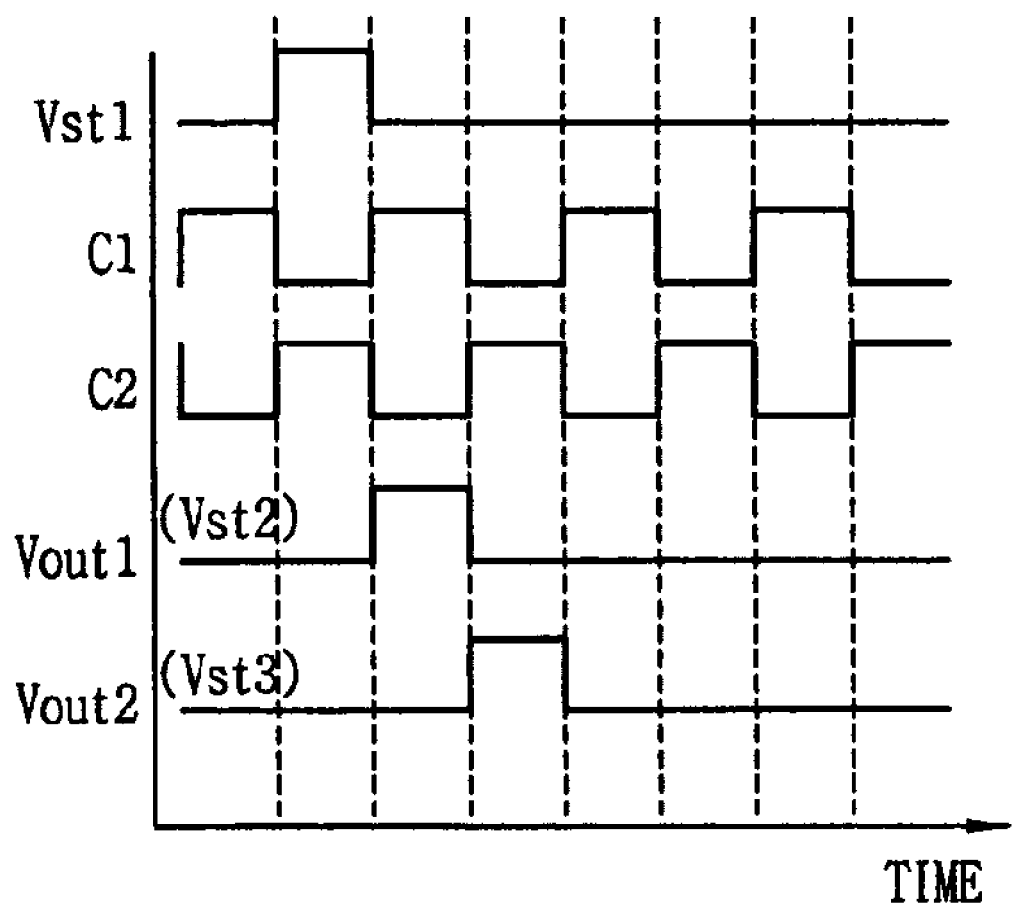
FIG. 4 is a view showing a waveform of the shift register of FIG. 3 according to the related art.

As shown, the shift register according to the present invention has a structure similar to that of the related art shift register as shown in FIG. 3. Accordingly, the explanation for the same constructions will be omitted and only the differences therebetween will be explained.

The shift register according to the present invention is different from the related art shift register shown in FIG. 3 in that the shift register according to the present invention is provided with a means for removing noise included in a start signal. That is, the shift register according to the present invention comprises a cleaner transistor Tc turned on as a first clock signal C1 is applied thereto for removing noise of the start signal. The start signal comprises a start voltage Vst1 provided at a first stage and a cascaded clock signal of the previous stage like a start voltage Vst2. That is, the previous stage provides the cascaded clock signal with the next stage as a start signal. The shift register further comprises a T9 transistor turned on by a charged voltage of a first node ND1 for outputting the cascaded clock signal as the start signal of the next stage.

The operation of the shift register according to a first embodiment of the present invention according to FIG. 5 will be further explained with reference to FIG. 6. As shown in FIG. 6, a start voltage Vst1 of a high state is inputted to a shift register of a first stage, and then a first clock signal C1 of a low state and a second clock signal C2 of a high state are inputted thereto. Accordingly, a T1 transistor and a T6 transistor are turned on, thereby charging a first node ND1 by a high driving voltage Vdd and discharging a second node ND2. Accordingly, a T7 transistor is turned on and an T8 transistor is turned off, thereby outputting the first clock signal C1 of a low state through the T7 transistor. Therefore, an output voltage Vout1 becomes low. The low output voltage Vout1 is inputted to a shift register of a next stage as a start voltage Vst2 through a T9. The start voltage Vst2 is the cascaded clock signal from the previous stage.

The cleaner transistor Tc receiving the start signal like the start voltage Vst1 or the cascaded clock signal is turned on by the first clock signal C1. Accordingly, the cleaner transistor Tc is turned on when the first clock signal C1 is high, and is turned off when the first clock signal C1 is low, so that a cleaner signal CL1 becomes equal to the first clock signal C1. That is, when the first clock signal C1 is high, the cleaner transistor Tc is turned on and thereby the start voltage Vst1 is grounded out. Only when the first clock signal C1 is low, the cleaner transistor Tc is turned off and thereby the start voltage Vst1 is applied to the T1 transistor and the T6 transistor. The cleaner transistor Tc has a gate for receiving the clock signal from the clock generating unit and a drain is grounded.

Noise included in the start voltage Vst2 of the shift register of the next stage and outputted from the T9 transistor is generated only when the first clock signal C1 inputted to the source of the T9 transistor is high. Accordingly, the cleaner transistor Tc is operated by being synchronized with the noise included in the start voltage Vst2, thereby removing the noise included in the start voltage Vst2 by a ground connection as the cleaner transistor Tc is turned on.

When the start voltage Vst1 becomes low and a first clock signal C1 of a high state and a second clock signal C2 of a low state are inputted to the shift register, the T1 transistor is turned off and thus the first node ND1 becomes a floating state. Accordingly, the T7 transistor maintains the ON state, and the T5 transistor is turned off thereby to discharge the second node ND2. Since the first clock signal C1 of a high state is outputted through the T7 transistor, the output voltage Vout 1 becomes high.

While the start voltage Vst1 maintains the low state, the first node ND1 maintains the floating state and thereby the first clock signal C1 of a low state is outputted as the output voltage Vout1. Then, the T4 transistor is turned on by a high output voltage from the shift register of the next stage and thereby the floating state of the first node ND1 is removed. Accordingly, the T7 transistor is turned off, so that the output voltage Vout1 of the low state becomes low and maintains the low state.

As the start voltage Vst1 is inputted to the shift register of the first stage, an output voltage Vout1 is outputted to an output terminal of the shift register of the first stage. The output voltage is applied to a first gate line of the LCD device. When the output voltage Vout1 is outputted from the shift register of the first stage, the shift register of the next stage is enabled thereby to output an output voltage Vout2 to a gate line of a next column. The start voltage Vst2 applied to the shift register of the second stage is an output signal of the T9 transistor.

As shown in FIG. 5, the clock signal outputted on the output terminal and the cascaded clock signal outputted to the shift register of the next stage are provided by different transistors which are separated form each other. That is, the clock signal as the output signal of the shift register is come from the T7 transistor and the cascaded clock signal as the start signal of the next stage is come from T9 transistor. The clock signal and the cascaded clock signal are isolated from each other.

As shown in FIG. 5, the T9 transistor is turned on by a voltage charged to the first node ND1 like the T7 transistor, so that the T9 transistor is synchronized with the T7 transistor. Accordingly, the output voltage Vout1 is applied to the gate line, and at the same time, the start voltage Vst2 is inputted to the shift register of the next stage.

The start voltage Vst2 is applied to the shift register of the next stage under a state that the additional T9 transistor is provided due to the following reasons. Since a resistance and a capacitor are generally connected to an output terminal of the shift register, an attenuated signal (that is, the output voltage Vout1) is outputted to the output terminal. Moreover, since the shift register of the current stage is connected to the shift register of the next stage by a metal line formed on a substrate, a charge may be generated by an interference between the metal line and an external circuit, etc. or an undesired potential may be generated thereby to attenuate a signal. Accordingly, in case the output voltage Vout1 is inputted to the shift register of the next stage as a start voltage, the start voltage is greatly distorted by an attenuation at the output terminal and the attenuation generated as the output voltage passes through the metal line, thereby causing the shift register to not operate at the next stage. However, in the present invention, the additional T9 transistor is provided thereby to prevent the above problems. When the attenuation of the signal is not great, the output voltage Vout1 may be used as the start voltage.

As mentioned above, the shift register of the LCD device according to the present invention is provided with the cleaner means for removing noise included in the start voltage, thereby always inputting a precise signal to the shift register. Accordingly, improper operation of the shift register due to noise is prevented and thereby an unnecessary signal is not applied to the LCD device.

Figure 7:
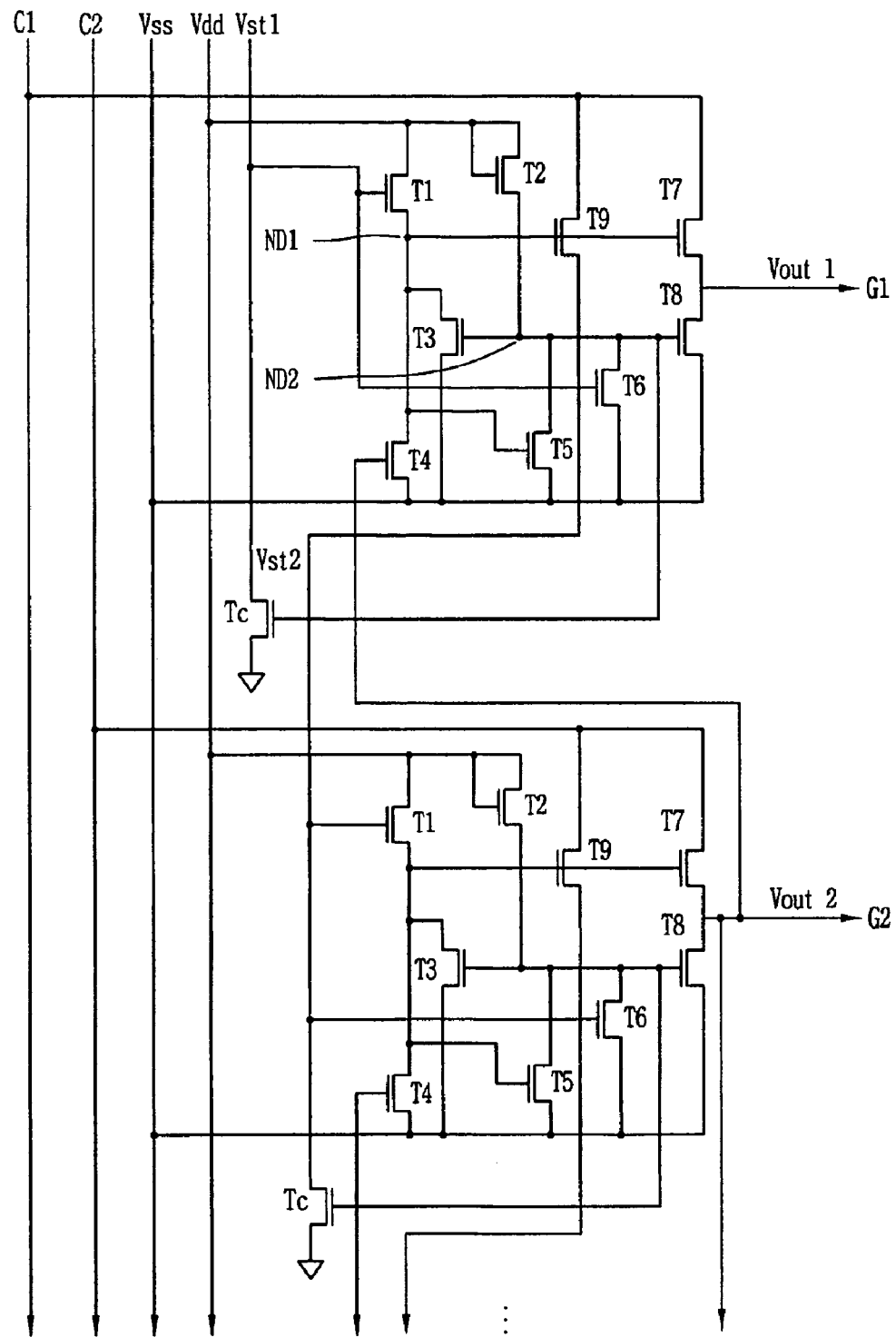
FIG. 7 is a circuit diagram showing a shift register according to a second embodiment of the present invention.
Figure 8:
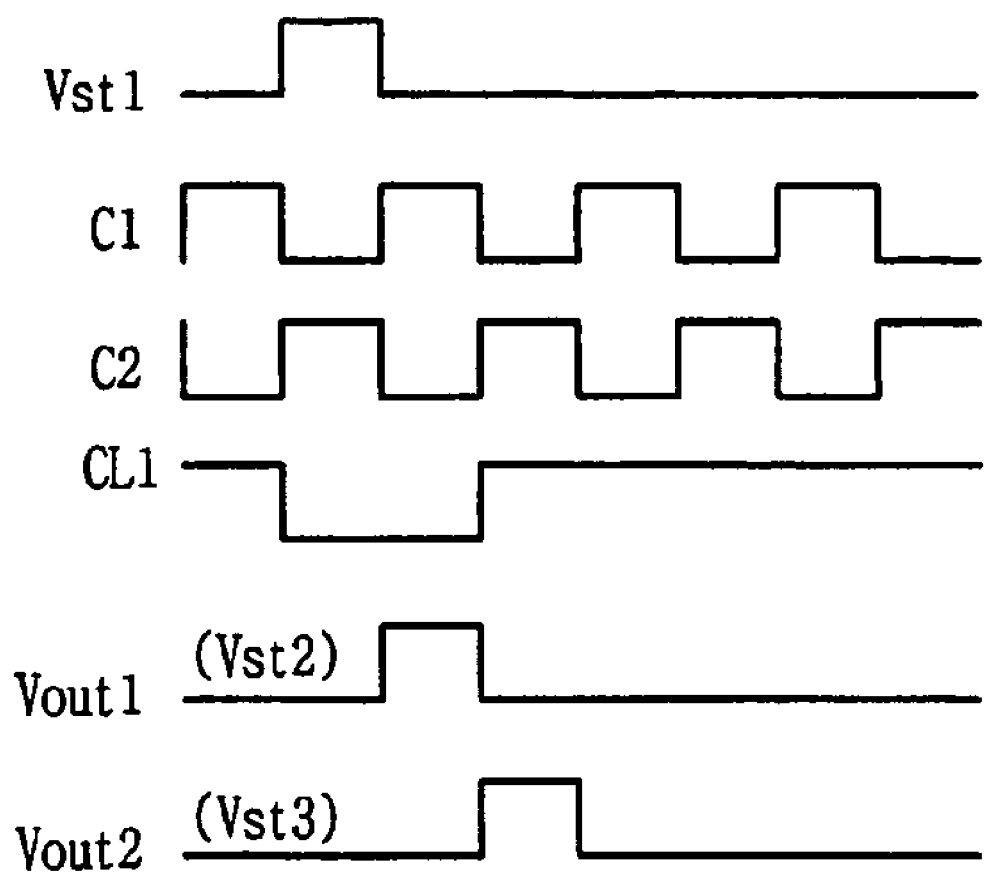
FIG. 8 is a view showing a waveform of the shift register of FIG. 7.

FIG. 7 is a circuit diagram showing a shift register of an LCD device according to a second embodiment of the present invention, and FIG. 8 is a view showing a waveform of the shift register of FIG. 7.

The shift register shown in FIG. 7 is similar to the shift register shown in FIG. 5 in aspect of the structure and operation except for the structure of the cleaner transistor Tc for removing noise included in a start voltage. Hereinafter, the same explanation will be omitted and the structure and operation of the cleaner transistor Tc will be explained.

As shown, a gate of the cleaner transistor Tc is connected to a second node ND2, a start voltage Vst1 is inputted to a source of the cleaner transistor Tc, and a drain of the cleaner transistor Tc is connected to a ground. The cleaner transistor Tc has a gate connected to the T8 transistor. Also, a gate of the T9 transistor is connected to a first node ND1.

As shown in FIG. 8, when a start voltage Vst1 of a high state is inputted to the shift register during a first stage and a first clock signal C1 of a low state and a second clock signal C2 of a high state are inputted thereto, the T1 transistor and the T6 transistor are turned on in FIG. 7. Accordingly, the first node ND1 is charged by a high driving voltage Vdd and the second node ND2 is discharged. Accordingly, the T7 transistor is turned on and the T8 transistor is turned off, thereby outputting the first clock signal C1 of a low state through the T7 transistor. Accordingly, the output voltage Vout1 of a low state is applied to the gate line G1. The low output voltage Vout1 is inputted to the shift register of the next stage as a start voltage Vst2. Since a low signal is applied to the gate of the cleaner transistor Tc, the start voltage Vst1 is inputted to the shift register.

When a start voltage Vst1 of a low state, a first clock signal C1 of a high state, and a second clock signal C2 of a low state are inputted to the shift register, the T1 transistor is turned off and thus the first node ND1 becomes a floating state. Accordingly, the T7 transistor maintains the ON state, and the T5 transistor is turned on thereby to discharge the second node ND2. Accordingly, the first clock signal C1 of a high state is outputted through the T7 transistor thereby to be applied to the gate line G1, and at the same time, the first clock signal C1 is outputted through the T9 transistor thereby to be inputted to the shift register for the next stage as the start voltage Vst2. The cleaner transistor Tc maintains the off state and the start voltage Vst1 is applied to the shift register.

While the start voltage Vst1 maintains the low state, the first node ND1 maintains the floating state and thereby the first clock signal C1 of the low state is applied to the gate line G1 as the output voltage Vout1. Then, the cleaner transistor Tc is turned on thereby to remove noise included in the start voltage by a ground connection.

Until a new start voltage of a high state is inputted into the shift register, the output voltage Vout1 maintains the low state and the cleaner transistor Tc maintains the ON state, thereby removing noise included in the start voltage.

In the shift register shown in FIG. 5 according to the first embodiment of the present invention, the cleaner transistor Tc for removing noise included in the start voltage is operated by external signals, that is, the clock signals C1 and C2. However, in the shift register according to the second embodiment of the present invention according to FIG. 7, the cleaner transistor Tc is operated by a signal of the shift register itself, that is, a voltage charged to the second node ND2. As the cleaner transistor Tc is operated by a signal of the shift register itself, a signal applied to the cleaner transistor Tc has a waveform different from the waveform of a signal applied to the cleaner transistor shown in FIG. 5 (that is, the operation time of the cleaner transistor Tc shown in FIG. 7 is different from the operation time of the cleaner transistor Tc shown in FIG. 5) and thereby the effect for removing noise is also different for each.

As mentioned above, noise included in a signal is generated not only by the capacitance of an output terminal but also by an interference between a metal line for connecting the shift registers to each other and an external circuit. Even if noise generated at the metal line is less than noise generated at the output terminal, the noise generated at the metal line may cause improper operation of the circuit.

In the first embodiment, the cleaner transistor Tc is periodically turned on/off by the clock signals C1 and C2, so that noise is removed only in the period that the clock signals C1 and C2 are applied to the transistor of the output terminal. However, in the second embodiment, a signal shown in FIG. 8 is inputted to the cleaner transistor Tc by using an inner signal thereby to prolong the period for removing noise. Accordingly, noise within a signal that passes through a metal line due to an interference with an external circuit can be effectively removed.

The shift registers shown in FIGS. 5 and 7 are operated by clock signals of two phases, the first clock signal C1 and the second clock signal C2. However, the present invention can be operated not only by the clock signals of two phases but also by clock signals of three or more phases.

The shift register is formed at an image non-display region of a liquid crystal panel, and sequentially applies an output voltage (that is, a scan signal) to gate lines formed at an image display region. As the output voltage is applied to the gate lines, a thin film transistor connected to the gate lines is operated and an image signal is applied to a pixel.

In the present invention, the cleaner means is provided to remove noise within a signal, thereby preventing improper operation of the shift register and thus preventing an inadequacy of the LCD device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A shift register structure comprising:
a shift register configured to receive a start signal and at least a clock signal as input signals, and configured to output the clock signal as an output signal on an output terminal and sequentially output a cascaded clock signal as the start signal for next stages, wherein the clock signal and the cascaded clock signal are provided by different transistors, which are separate each other; and
cleaner means for receiving the start signal for removing noise included in the start signal.

2. The shift register structure of claim 1, wherein the shift register is formed of an amorphous semiconductor device.

3. The shift register structure of claim 1, wherein the cleaner means is a cleaner transistor for receiving the start signal.

4. The shift register structure of claim 1, wherein the shift register receives the clock signal of two phases.

5. The shift register structure of claim 1, wherein the shift register receives the clock signal of three phases.

6. The shift register structure of claim 1, wherein the start signal is a start voltage provided at a first stage and at the cascaded clock signal of a previous stage.

7. The shift register structure of claim 1, wherein the cleaner means is a cleaner transistor including a gate configured to receive the clock signal.

8. The shift register structure of claim 1, wherein the cleaner means is a cleaner transistor including a gate coupled to the shift register.

9. The shift register structure of claim 1, wherein the different transistors include a T7 transistor outputting the clock signal on an output terminal, and a T9 transistor outputting the cascaded clock signal as the start signal of a next stage.

10. The shift register structure of claim 9, the shift register further comprising a T8 transistor coupled to a gate of the cleaner means, which is a cleaner transistor.

11. The shift register structure of claim 10, wherein the shift register further comprises:
   a T1 transistor including a gate to which the start voltage is applied, a source to which a driving voltage is applied, and a drain connected to a first node;
   a T2 transistor including a gate and a source to which the driving voltage is applied, and a drain connected to a second node;
   a T4 transistor including a gate connected to an output terminal of a shift register of a next stage and a source connected to the first node, for discharging the first node and charging the second node; and
   a T5 transistor including a gate connected to the first node and a source connected to the second node, for discharging the second node;
   wherein the T7 transistor includes a gate connected to the first node, a source connected to the clock signal, and a drain connected to the output terminal, for outputting the clock signal to the output terminal;
   wherein the T8 transistor includes a gate connected to the second node and a source connected to the output terminal, for lowering the clock signal outputted by the T7 transistor to a low potential.

12. A liquid crystal display (LCD) device comprising:
   a liquid crystal panel having pixels defined by gate lines and data lines and thin film transistors formed in each pixel, for displaying an image;
   a shift register comprising:
      a T7 transistor configured to output a clock signal on an output terminal;
      a T9 transistor configured to output a cascaded clock signal as a start voltage of a next stage, wherein the clock signal and the cascaded clock signal are isolated from each other; and
      cleaner means for removing noise from the cascaded clock signal.

13. The LCD device of claim 12, wherein the shift register further comprises:
   a T1 transistor including a gate to which a start voltage is applied, a source to which a driving voltage is applied, and a drain connected to a first node;
   a T2 transistor including a gate and a source to which the driving voltage is applied, and a drain connected to a second node;
   a T4 transistor including a gate connected to an output terminal of a shift register of a next stage and a source connected to the first node, for discharging the first node and charging the second node;
   a T5 transistor including a gate connected to the first node and a source connected to the second node, for discharging the second node;
   the T7 transistor including a gate connected to the first node, a source connected to the clock signal, and a drain connected to the output terminal, for outputting the clock signal to the output terminal; and
   a T8 transistor including a gate connected to the second node and a source connected to the output terminal, for lowering the clock signal passed by the T7 transistor to a low potential.

14. The LCD device of claim 12, wherein the cleaner means comprises a cleaner transistor that is provided with the cascaded clock signal.

15. The LCD device of claim 12, wherein the cleaner means comprises a cleaner transistor that is provided with a voltage charged to the second node.

16. The LCD device of claim 12, further comprising:
   a clock generating unit for applying the clock signal to the shift register; and
   a data driving unit for applying image information to the liquid crystal panel.

17. The LCD device of claim 16, wherein the cleaner means is a cleaner transistor comprising a gate, a source and a drain,
   the gate of the cleaner transistor is connected to the clock generating unit, the drain of the cleaner transistor is grounded.

18. The LCD device of claim 12, wherein the shift register is formed at the liquid crystal panel.

19. The LCD device of claim 12, wherein the shift register is formed of an amorphous semiconductor device.

20. A method of a driving a shift register for an LCD comprising:
   providing a starter voltage as an input to the shift register;
   outputting a clock signal on an output terminal;
   sequentially outputting the cascaded clock signal as a starter voltage of a next shift register; and
   inputting the starter voltage to a circuit element for removing noise from the starter voltage, wherein the clock signal on the output terminal is provided by an element separate from an element providing the cascaded clock signal.

21. The method of claim 20, wherein the circuit element comprises a cleaner transistor operative to remove noise from the starter voltage.

22. A shift register structure comprising:
   a shift register for sequentially outputting voltages in stages, wherein the shift register comprises:
      a T9 transistor for outputting a clock signal of the shift register as a start voltage of a next stage by being synchronized with an output signal on an output terminal of the shift register;
      a T1 transistor including a gate to which a start voltage of the shift register is applied, a source to which a driving voltage is applied, and a drain connected to a first node;
      a T2 transistor including a gate and a source to which the driving voltage is applied, and a drain connected to a second node;
      a T4 transistor including a gate connected to an output terminal of a shift register of a next stage and a source connected to the first node, for discharging the first node and charging the second node;
      a T5 transistor including a gate connected to the first node and a source connected to the second node, for discharging the second node;

a T7 sixth transistor including a gate connected to the first node, a source receiving the clock signal, and a drain connected to an output terminal, for passing the clock signal to the output terminal;

a T8 transistor including a gate connected to the second node and a source connected to the output terminal, for lowering the clock signal outputted by the T7 sixth transistor to a low potential; and a cleaner transistor turned on by the clock signal and operative to remove noise from the start voltage of the sift register or the shift register of the next stage.

* * * * *

UNITED STATES PATENT AND TRADEMARK OFFICE
CERTIFICATE OF CORRECTION

PATENT NO. : 7,349,519 B2 Page 1 of 1
APPLICATION NO. : 11/171562
DATED : March 25, 2008
INVENTOR(S) : Yong-Ho Jang et al.

It is certified that error appears in the above-identified patent and that said Letters Patent is hereby corrected as shown below:

Column 12, in claim 22, line 5, before "register or the shift" delete "sift" and substitute --shift-- in its place.

Signed and Sealed this

Fifth Day of August, 2008

JON W. DUDAS
*Director of the United States Patent and Trademark Office*